US010011902B1

(12) United States Patent
Philippe et al.

(10) Patent No.: US 10,011,902 B1
(45) Date of Patent: Jul. 3, 2018

(54) PROCESS FOR FABRICATING COMPOSITE PARTS BY LOW MELTING POINT IMPREGNATION

(71) Applicant: HERAKLES, Le Haillan (FR)

(72) Inventors: Eric Philippe, Merignac (FR); Eric Bouillon, Le Haillan (FR); Emilie Courcot, Le Taillan (FR); Sébastien Jimenez, Bordeaux (FR)

(73) Assignee: HERAKLES, Le Haillan (FR)

( * ) Notice: Subject to any disclaimer, the term of this patent is extended or adjusted under 35 U.S.C. 154(b) by 70 days.

(21) Appl. No.: 14/906,959

(22) PCT Filed: Jul. 15, 2014

(86) PCT No.: PCT/FR2014/051821
§ 371 (c)(1),
(2) Date: Jan. 22, 2016

(87) PCT Pub. No.: WO2015/011371
PCT Pub. Date: Jan. 29, 2015

(30) Foreign Application Priority Data

Jul. 23, 2013 (FR) ..................... 13 57238

(51) Int. Cl.
*C23C 16/00* (2006.01)
*C23C 16/22* (2006.01)
(Continued)

(52) U.S. Cl.
CPC ........ *C23C 16/22* (2013.01); *C04B 35/62844* (2013.01); *C04B 35/62868* (2013.01);
(Continued)

(58) Field of Classification Search
CPC .............. C23C 16/22; C04B 35/62844; C04B 35/62868; C04B 35/62873; C04B 35/80; C04B 35/806; C04B 35/83
See application file for complete search history.

(56) References Cited

U.S. PATENT DOCUMENTS 4,889,686 A 12/1989 Singh et al.
4,944,904 A 7/1990 Singh et al.
(Continued)

FOREIGN PATENT DOCUMENTS

FR 2 851 244 A1 8/2004
FR 2 983 193 A1 5/2013
(Continued)

OTHER PUBLICATIONS

International Search Report as issued in International Patent Application No. PCT/FR2014/051821, dated Oct. 21, 2014.
(Continued)

*Primary Examiner* — Kelly M Gambetta
(74) *Attorney, Agent, or Firm* — Pillsbury Winthrop Shaw Pittman LLP

(57) ABSTRACT

A method of fabricating a composite material part, the method including making a consolidated fiber preform, the fibers of the preform being carbon or ceramic fibers and being coated with an interphase; obtaining a consolidated and partially densified fiber preform, the partial densification comprising using chemical vapor infiltration to form a first matrix phase on the interphase; and continuing densification of the fiber preform by infiltrating an infiltration composition containing at least silicon and at least one other element suitable for lowering the melting temperature of the infiltration composition to a temperature less than or equal to 1150° C.

19 Claims, 1 Drawing Sheet

(51) Int. Cl.
*C04B 35/628* (2006.01)
*C04B 35/80* (2006.01)
*C04B 35/83* (2006.01)

(52) U.S. Cl.
CPC ........ *C04B 35/62873* (2013.01); *C04B 35/80* (2013.01); *C04B 35/806* (2013.01); *C04B 35/83* (2013.01); *C04B 2235/5216* (2013.01); *C04B 2235/5244* (2013.01); *C04B 2235/5248* (2013.01); *C04B 2235/5252* (2013.01)

(56) References Cited

U.S. PATENT DOCUMENTS

| | | |
|---|---|---|
| 5,015,540 A | 5/1991 | Borom et al. |
| 5,246,736 A | 9/1993 | Goujard et al. |
| 5,738,951 A | 4/1998 | Goujard et al. |
| 5,965,266 A | 10/1999 | Goujard et al. |
| 6,068,930 A | 5/2000 | Lamouroux et al. |
| 6,110,535 A | 8/2000 | Rey et al. |
| 6,284,358 B1 | 9/2001 | Parlier et al. |
| 7,736,554 B2 | 6/2010 | Thebault et al. |
| 9,238,595 B2 | 1/2016 | Bouillon et al. |
| 2004/0192534 A1* | 9/2004 | Nixon .................. C04B 35/565 501/95.2 |
| 2006/0169404 A1 | 8/2006 | Thebault et al. |
| 2011/0027098 A1* | 2/2011 | Noe ...................... C04B 35/573 416/241 B |
| 2012/0076927 A1* | 3/2012 | Bhatt .................... C04B 35/565 427/122 |
| 2013/0084189 A1* | 4/2013 | Diego ................... C04B 37/001 416/241 B |
| 2014/0363574 A1* | 12/2014 | Lazur ................... C04B 35/573 427/255.38 |

FOREIGN PATENT DOCUMENTS

| | | |
|---|---|---|
| JP | 2000-500112 A | 1/2000 |
| JP | 2005-320236 A | 11/2005 |
| JP | 2012-510890 A | 5/2012 |
| RU | 2184715 C2 | 7/2002 |
| RU | 2194683 C2 | 12/2002 |
| WO | WO 01/07377 A1 | 2/2001 |

OTHER PUBLICATIONS

Notice of Rejection as issued in Japanese Patent Application No. 2016-528574, dated Mar. 27, 2018.

Office Action as issued in Russian Patent Application No. 2016105679, dated Apr. 4, 2018.

* cited by examiner

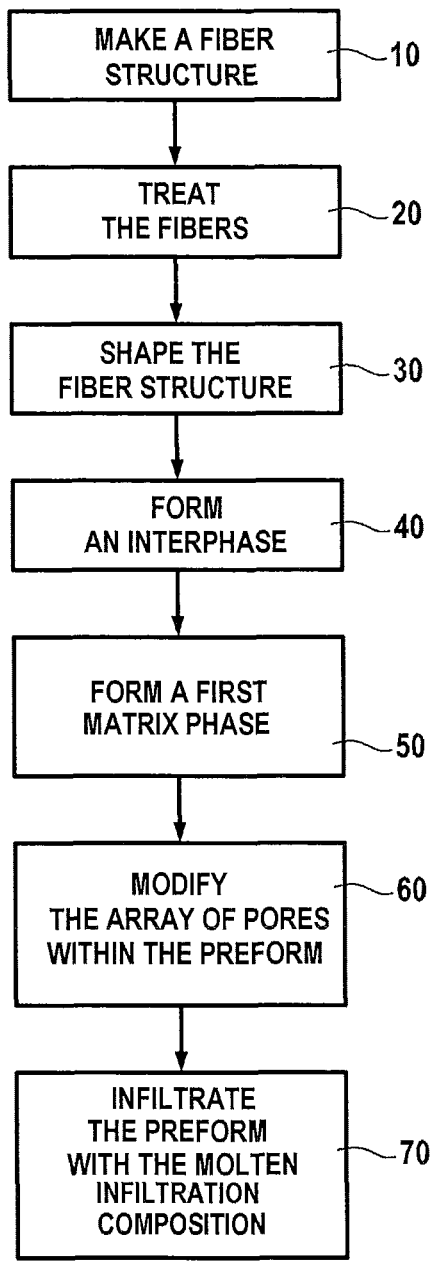

PROCESS FOR FABRICATING COMPOSITE PARTS BY LOW MELTING POINT IMPREGNATION

CROSS-REFERENCE TO RELATED APPLICATIONS

This application is the U.S. National Stage of PCT/FR2014/051821, filed Jul. 15, 2014, which in turn claims priority to French patent application number 1357238, filed Jul. 23, 2013. The content of these applications are incorporated herein by reference in their entireties.

BACKGROUND OF THE INVENTION

The invention relates to the infiltration compositions used both when making composite material parts having a matrix that is ceramic or at least partially ceramic, referred to below as ceramic matrix composite (CMC) material and when making parts made of carbon/carbon (C/C) composite material.

The field of application of the invention is making parts that are to be exposed in service to high temperatures, in particular in the fields of aviation and space, in particular hot parts for aeroengines, it being understood that the invention may be applied to other fields, e.g. the field of industrial gas turbines.

CMC and C/C composite materials present good thermostructural properties, i.e. strong mechanical properties that make them suitable for constituting structural parts, together with the ability to conserve those properties at high temperatures.

Using CMC or C/C materials instead of metals for making parts that are exposed in service to high temperatures has therefore already been recommended, particularly since CMC and C/C materials present significantly lower density than the metal materials they replace.

A well-known method of fabricating CMC material parts consists in making a preform from fiber plies of carbon fibers or silicon carbide (SiC) fibers and in infiltrating the preform with a composition based on molten silicon so as to form a ceramic matrix. Such a densification process is known as melt infiltration (MI). By way of example, reference may be made to the following documents: U.S. Pat. No. 4,889,686, U.S. Pat. No. 4,944,904, or U.S. Pat. No. 5,015,540. The infiltration composition is based mainly on silicon, since that element presents a coefficient of thermal expansion that is close to that of the fibers of the preform. The infiltration composition may correspond to silicon on its own or to a silicon alloy that generally contains a small amount of one or more other elements such as titanium, molybdenum, boron, iron, niobium, etc.

Densification by the MI process presents the advantage of being faster and easier to perform than densification by chemical vapor infiltration (CVI). Nevertheless, the silicon-based infiltration composition that is used can present a melting point or temperature that is higher than the thermal stability temperature of the fibers of the preforms (heat stability). Under such circumstances, the fibers may be subjected to degradation while the molten composition is being infiltrated into the preform, which can reduce the mechanical properties of the fibers by a considerable amount.

OBJECT AND SUMMARY OF THE INVENTION

A particular object of the invention is to provide a method of fabricating a composite material part that does not present the above drawbacks.

This object is achieved by a method of fabricating a composite material part, the method comprising the steps of:
making a consolidated fiber preform, the fibers of the preform being carbon or ceramic fibers and being coated with an interphase;
obtaining a consolidated and partially densified fiber preform, the partial densification comprising using chemical vapor infiltration to form a first matrix phase on the interphase; and
continuing densification of the fiber preform by infiltrating an infiltration composition containing at least silicon and at least one other element suitable for lowering the melting temperature of the infiltration composition to a temperature less than or equal to 1150° C.

Specifically, by adding to the silicon an element that makes it possible to have an infiltration composition presenting a melting point that is less than or equal to 1150° C., an infiltration composition is obtained that remains within the thermal stability temperature range of most fibers, and in particular of the ceramic fibers that are used for making the fiber reinforcement of a CMC material. Thus, the method of the invention for fabricating a composite material part by using an MI type densification process can be performed without risk of damaging the fibers of the preform.

In a first aspect of the method of the invention, the infiltration composition includes nickel, the proportion by weight of nickel in said composition lying in the range 50% to 75%. With a nickel content lying in the range 50% to 75% in addition to the silicon, an infiltration composition is obtained having its melting point less than or equal to 1150° C.

In a second aspect of the method of the invention, the infiltration composition includes germanium, the proportion by weight of germanium in said composition lying in the range 89% to 98%. With at least 89% germanium in addition to the silicon, an infiltration composition is obtained having its melting point less than or equal to 1150° C.

In a third aspect of the method of the invention, the infiltration composition includes, in addition to the element suitable for reducing the melting temperature of the infiltration composition to a temperature less than or equal to 1150° C., less than 10% (percentage by weight) of at least one of the following elements: aluminum and boron. Adding at least one of these ingredients makes it possible to improve the deoxidization and/or the wettability of the infiltration composition on the substrate for treatment, and also to impart particular properties to the treated material, such as better ability to withstand oxidation and corrosion.

In a fourth aspect of the method of the invention, the fiber preform is made of carbon fibers or of silicon carbide (SiC) fibers.

In a fifth aspect of the method of the invention, the fiber preform is formed as a fiber structure made as a single part by three-dimensional or multilayer weaving or from a plurality of two-dimensional fiber plies.

In a sixth aspect of the method of the invention, the interphase is formed by at least one layer of any one of the following materials: pyrolytic carbon (PyC), boron-doped carbon (BC), and boron nitride (BN).

The PyC, BC, or BN interphase in this example has a conventional function of providing the composite material with embrittlement relief because of the sheet structure of the PyC, BC, or BN, which helps deflect cracks that reach the interphase after they have propagated through the matrix, thereby preventing such cracks from rupturing fibers, or at least retarding any such rupture.

The term "boron-doped carbon", or "BC", is used to mean a composition containing 5 atomic percent (at %) B to 20 at % B, the remainder being carbon. Such a composition presents a structure that is turbostratic, i.e. in which there is disorientation among stacked sheets, which is favorable to the embrittlement-relief function.

In a seventh aspect of the method of the invention, the first matrix phase comprises at least one layer of a material selected from at least one of the following materials: a self-healing material, silicon nitride ($Si_3N_4$), and silicon carbide (SiC). The self-healing material is selected from a ternary Si—B—C system and boron carbide $B_4C$.

The first layer of the matrix may comprise a plurality of layers of self-healing material alternating with one or more layers of material selected from pyrolytic carbon (PyC), boron-doped carbon (BC), and a ceramic material that does not contain boron.

In an implementation of the method, the first matrix phase is formed with a single layer of self-healing material or with a plurality of layers of self-healing material and includes at least one layer of ceramic material that does not contain boron, which layer is formed on the single layer or the last layer of self-healing material.

Said layer of ceramic material that does not contain boron may have a thickness of not less than 500 nanometers (nm).

Said layer of ceramic material that does not contain boron may be made of silicon carbide (SiC) or indeed of silicon nitride ($Si_3N_4$).

In an eighth aspect of the method of the invention, after partial densification of the fiber preform and before densification of the fiber preform by infiltration with an infiltration composition, the method includes a step of modifying the array of pores within the fiber preform, which modification is performed by means of any one of the following treatments:
  dispersing a powder of at least one of the following materials within the preform: silicon carbide (SiC); silicon nitride ($Si_3N_4$); carbon (C); boron (B); boron carbide ($B_4C$); and titanium carbide (TiC);
  introducing a ceramic or a carbon phase within the preform by impregnating said preform with a polymer, and pyrolyzing said polymer; or
  introducing a carbon or ceramic foam within the preform by impregnating said preform with a polymer, and pyrolyzing said polymer.

BRIEF DESCRIPTION OF THE DRAWING

The invention can be better understood on reading the following description given by way of non-limiting indication with reference to the sole FIGURE, which shows successive steps of a method of fabricating a CMC material part in an implementation of the invention.

DETAILED DESCRIPTION OF IMPLEMENTATIONS

The invention proposes a method of fabricating parts made out of composite materials, in particular out of thermostructural ceramic matrix composite (CMC) materials, i.e. materials formed by reinforcement made of carbon or of ceramic fibers and densified by a matrix that is ceramic at least in part, and also made out of thermostructural carbon/carbon (C/C) composite materials, i.e. materials formed by carbon fiber reinforcement densified by a carbon matrix.

The fabrication method of the invention is remarkable in that it uses an infiltration composition that presents a melting temperature that is lower than that of the silicon-based infiltration compositions that are commonly used for densifying fiber preforms. More particularly, the infiltration composition used in the invention makes it possible to infiltrate fiber preforms with a molten composition at a temperature lower than the thermal stability temperature of the fibers (heat stability), i.e. a temperature that is low enough to avoid any degradation of the mechanical properties of the fibers of the preform during infiltration, as applies in particular to first generation SiC fibers. In accordance with the invention, the fiber preform is infiltrated with an infiltration composition that melts at a temperature lower than or equal to 1150° C.

For this purpose, in addition to silicon, the infiltration composition contains at least one other element suitable for lowering the melting point or temperature of the composition to a temperature that is less than or equal to 1150° C. This lowering of the melting point of the infiltration composition may be obtained in particular by adding nickel (Ni) or germanium (Ge) to the silicon. More precisely, when adding nickel, the infiltration composition contains 50% to 75% (percentages by weight) of nickel, thus making it possible to obtain a melting point that lies in the range 1000° C. (infiltration composition containing 50% Si and 50% Ni) to 1150° C. (infiltration composition containing 25% Si and 75% Ni). When adding germanium, the infiltration composition contains 89% to 98% germanium, thus making it possible to obtain a melting point lying in the range 1000° C. (infiltration composition containing 2% Si and 98% Ge) and 1150° C. (infiltration composition containing 11% Si and 89% Ge). Thus, by adding a nickel content lying in the range 50% to 75% or at least 89% germanium to the silicon, a silicon alloy is obtained that presents a melting temperature that is less than or equal to 1150° C., which is a temperature lower than the thermal stability temperature of fibers made of silicon carbide (SiC) (referred to below as SiC fibers), such as for example first generation Nicalon®, Tyranno Lox-M®, or Tyranno ZMI® type SiC fibers.

In addition to a lower melting point, the infiltration composition presents all of the other properties required for enabling a composite material of good quality to be fabricated. Specifically, the infiltration composition is chemically compatible with the elements present in the preform for infiltrating. The infiltration composition also presents good resistance to oxidizing or corrosive environments, and excellent long-term behavior.

The infiltration composition may also include less than 10% (percentage by weight) of at least one of the following elements: aluminum and boron. Adding at least one of these ingredients serves to improve the deoxidizing and/or the wettability of the infiltration composition on the substrate for treatment, thereby imparting special properties to the treated material, such as improved ability to withstanding oxidation and corrosion.

A first implementation of a method of fabricating a CMC material in accordance with the invention is described below with reference to the sole FIGURE.

A first step 10 consists in making a fiber structure from which a fiber preform of shape close to that of the part that is to be fabricated is to be made. Such a fiber structure may be obtained by multilayer or three-dimensional weaving using yarns or tows. It is also possible to start from two-dimensional fiber textures such as woven fabrics or sheets of yarns or tows in order to form plies that are subsequently draped over a shaper and possibly bonded together, e.g. by stitching or by implanting yarns.

The fibers constituting the fiber structure are preferably ceramic fibers, e.g. fibers made essentially of silicon carbide SiC (referred to below as SiC fibers), or of silicon nitride $Si_3N_4$. It is also possible to use the SiC fibers as sold under the names "Tyranno ZMI", "Tyranno Lox-M", and "Tyranno SA3" by the Japanese supplier Ube Industries, Limited, or "Nicalon", "Hi-Nicalon", and "Hi-Nicalon(S)", sold by the Japanese supplier Nippon Carbon. In a variant, it is also possible to use carbon fibers.

In known manner, with ceramic fibers, and in particular SiC fibers, it is preferable to perform surface treatment (step 20) on the fibers prior to forming an interphase coating in order to eliminate both the sizing and a surface oxide layer such as silica $SiO_2$ present on the fibers.

Step 30 consists in shaping the fiber structure with tooling in order to obtain a preform having a shape close to that of the part to be fabricated.

With the preform held in its shaping tooling, e.g. made of graphite, an embrittlement-relief interphase is formed by CVI on the fibers of the preform, this interphase being constituted in particular by pyrolytic carbon (PyC) or by boron nitride (EN), or by boron-doped carbon (BC), having 5 at % to 20 at % boron, the balance being carbon (step 40). The thickness of the PyC or BC interphase preferably lies in the range 10 nm to 1000 nm.

Thereafter (step 50), a first matrix phase is formed by CVI, the matrix possibly containing at least one layer of self-healing material. It is possible to select a self-healing material containing boron, e.g. a ternary Si—B—C system or boron carbide $B_4C$ that is capable, in the presence of oxygen, of forming a borosilicate type glass having self-healing properties. The thickness of the first matrix phase is not less than 500 nm, and preferably lies in the range 1 micrometer (µm) to 30 µm.

The first matrix phase may comprise a single layer of self-healing material or a plurality of layers of different self-healing materials. It is also possible to form the first matrix layer out of a plurality of layers of self-healing material alternating with layers of PyC or of BC or of ceramic material not containing boron, such as for example SiC or silicon nitride $Si_3N_4$.

A layer of ceramic material that does not contain boron, e.g. SiC or $Si_3N_4$, is formed on the layer of self-healing material when the first matrix phase comprises only one layer of self-healing material, or on the last layer of self-healing material when the first matrix phase comprises a plurality of layers of self-healing material, in order to constitute a reaction barrier between the self-healing material and the molten silicon or silicon-based liquid composition that is introduced subsequently.

The thickness of this layer of ceramic material forming a reaction barrier may be at least 500 nm, and typically lies in the range one to a several micrometers. Ceramic materials that do not contain boron and other than SiC or $Si_3N_4$ may be used to form the reaction barrier, for example refractory carbides such as ZrC or HfC.

The total thickness of the interphase together with the first matrix phase is selected to be sufficient to consolidate the fiber preform, i.e. to bind together the fibers of the preform sufficiently to allow the preform to be handled while conserving its shape without the assistance of support tooling. This thickness may be at least 500 nm. After consolidation, the preform remains porous, and for example its initial pores may be filled in to a minority extent only by the interphase and the first matrix phase.

It is known to use CVI to deposit PyC, BC, $B_4C$, Si—B—C, $Si_3N_4$, BN, and SiC. Reference may be made in particular to the following documents: U.S. Pat. No. 5,246,736, U.S. Pat. No. 5,738,951, U.S. Pat. No. 5,965,266, U.S. Pat. No. 6,068,930, and U.S. Pat. No. 6,284,358.

It may be observed that the interphase may be formed by CVI on the fibers of the fiber structure before the structure is shaped, providing the interphase is thin enough to avoid affecting the desired ability of the fiber structure to deform.

The porous consolidated preform is removed from its shaping tooling in order to continue densification by an MI type process comprising modifying the array of pores and infiltrating the preform with an infiltration composition.

The array of pores in the preform is modified (step 60) by means of one of the following treatments:
 dispersing a powder of at least one of the following materials within the preform: silicon carbide (SiC); silicon nitride ($Si_3N_4$); carbon (C); boron (B); boron carbide ($B_4C$); and titanium carbide (TiC);
 introducing a ceramic or a carbon phase within the preform by impregnating said preform with a polymer, and pyrolyzing said polymer; or
 introducing a carbon or ceramic foam within the preform by impregnating said preform with a polymer, and pyrolyzing said polymer.

In the presently-described example, the array of pores within the preform is modified by using an impregnation composition to disperse a powder. The impregnation composition may be a slip containing the powder in suspension in a liquid vehicle, e.g. water. The powder may be retained in the preform by filtering or by settling, possibly with the help of suction. It is preferable to use a powder made of particles having a mean size of less than 5 µm.

After drying, a consolidated preform is obtained having a carbon and/or ceramic powder dispersed within its pores.

Densification is continued (step 70) by infiltrating the preform with an infiltration composition, specifically in this example a composition containing 46% (percentage by weight) silicon and 54% (percentage by weight) of nickel, the composition being melted at a temperature of about 1000° C. Infiltration is performed under a non-oxidizing atmosphere, and preferably under reduced pressure.

When the previously introduced powder is made of carbon or if the material contains an accessible carbon phase, and when in the presence of a carbon residue of a resin used for impregnating the consolidated preform, the silicon reacts therewith to form silicon carbide SiC. When the previously introduced powder is made of ceramic, in particular a carbide, nitride, or silicide, and when in the presence of a ceramic residue of a resin used for impregnating the consolidated preform, a matrix that is made in part out of silicon is obtained binding the ceramic powder. Under all circumstances, the majority of the matrix is ceramic.

The invention claimed is:

1. A method of fabricating a composite material part, the method comprising:
 making a consolidated fiber preform, wherein fibers of the consolidated fiber preform comprising one of: carbon fibers or ceramic fibers, and wherein the fibers are coated with an interphase;
 obtaining a consolidated and partially densified fiber preform, wherein the consolidated and partially densified fiber preform is obtained by using chemical vapor infiltration to form a first matrix phase on the interphase of the consolidated fiber preform; and
 continuing densification of the consolidated and partially densified fiber preform by infiltrating the consolidated and partially densified fiber preform with an infiltration composition containing at least silicon and nickel suitable for lowering the melting temperature of the infiltration composition to a temperature less than or equal to 1150° C., wherein a first proportion by weight of nickel in the infiltration composition is within a first range of 54% to 75%.

2. A method according to claim 1, wherein:
the infiltration composition further includes germanium; and
a second proportion by weight of germanium in the infiltration composition is in a second range 89% to 98%.

3. A method according to claim 1, wherein the infiltration composition includes less than 10% by weight of at least one: aluminum and boron.

4. A method according to claim 1, wherein the consolidated fiber preform is made of carbon fibers or silicon carbide (SiC) fibers.

5. A method according to claim 1, wherein the consolidated fiber preform is formed as a fiber structure made as a single part by three-dimensional or multilayer weaving or from a plurality of two-dimensional fiber plies.

6. A method according to claim 1, wherein the interphase is formed by at least one layer of any one of the following materials: pyrolytic carbon (PyC), boron-doped carbon (BC), and boron nitride (BN).

7. A method according to claim 6, wherein the first matrix phase comprises at least one layer of a material selected from at least one of the following materials: a self-healing material, silicon nitride ($Si_3N_4$), and silicon carbide (SiC).

8. A method according to claim 7, wherein the first matrix phase includes at least one layer of self-healing material selected from a ternary Si—B—C system and boron carbide $B_4C$.

9. A method according to claim 1, wherein the first matrix phase comprises a plurality of layers of self-healing material alternating with one or more layers of material selected from pyrolytic carbon (PyC), boron-doped carbon (BC), and a ceramic material that does not contain boron.

10. A method according to claim 1, wherein, after partial densification of the consolidated fiber preform and before densification of the consolidated and partially densified fiber preform by infiltration with the infiltration composition, the method further comprises:
modifying an array of pores within the consolidated and partially densified fiber preform by one of:
dispersing a powder of at least one of the following materials within the consolidated and partially densified fiber preform: silicon carbide (SiC); silicon nitride ($Si_3N_4$); carbon (C); boron (B); boron carbide ($B_4C$); and titanium carbide (TiC);
introducing a ceramic or a carbon phase within the consolidated and partially densified preform by impregnating the consolidated and partially densified preform with a polymer, and pyrolyzing the polymer; or
introducing a carbon or ceramic foam within the consolidated and partially densified preform by impregnating the consolidated and partially densified preform with a polymer, and pyrolyzing the polymer.

11. A method of fabricating a composite material part, the method comprising:
making a consolidated fiber preform, wherein fibers of the consolidated fiber preform comprising one of: carbon fibers or ceramic fibers, and wherein the fibers are coated with an interphase;
obtaining a consolidated and partially densified fiber preform, wherein the consolidated and partially densified fiber preform is obtained by using chemical vapor infiltration to form a first matrix phase on the interphase of the consolidated fiber preform; and
continuing densification of the consolidated and partially densified fiber preform by infiltrating the consolidated and partially densified fiber preform with an infiltration composition containing at least silicon and germanium suitable for lowering the melting temperature of the infiltration composition to a temperature less than or equal to 1150° C., wherein a first proportion by weight of germanium in the infiltration composition is within a first range of 89% to 98%.

12. A method according to claim 11, wherein:
the infiltration composition further comprises nickel having a second proportion by weight in the infiltration composition in a second range of 50% to 75%.

13. A method according to claim 11, wherein the infiltration composition further includes less than 10% by weight of at least one of: aluminum and boron.

14. A method according to claim 11, wherein the consolidated fiber preform is made of carbon fibers or silicon carbide (SiC) fibers.

15. A method according to claim 11, wherein the consolidated fiber preform is formed as a fiber structure made as a single part by three-dimensional or multilayer weaving or from a plurality of two-dimensional fiber plies.

16. A method according to claim 11, wherein the interphase is formed by at least one layer of any one of the following materials: pyrolytic carbon (PyC), boron-doped carbon (BC), and boron nitride (BN).

17. A method according to claim 16, wherein:
the first matrix phase comprises at least one layer of a material selected from at least one of the following materials: a self-healing material, silicon nitride ($Si_3N_4$), and silicon carbide (SiC); and
the first matrix phase includes at least one layer of self-healing material selected from a ternary Si—B—C system and boron carbide $B_4C$.

18. A method according to claim 11, wherein the first matrix phase comprises a plurality of layers of self-healing material alternating with one or more layers of material selected from pyrolytic carbon (PyC), boron-doped carbon (BC), and a ceramic material that does not contain boron.

19. A method according to claim 11, wherein, after partial densification of the consolidated fiber preform and before densification of the consolidated and partially densified fiber preform by infiltration with the infiltration composition, the method further comprises:
modifying an array of pores within the consolidated and partially densified fiber preform by one of:
dispersing a powder of at least one of the following materials within the consolidated and partially densified fiber preform: silicon carbide (SiC); silicon nitride ($Si_3N_4$); carbon (C); boron (B); boron carbide ($B_4C$); and titanium carbide (TiC);
introducing a ceramic or a carbon phase within the consolidated and partially densified fiber preform by impregnating the consolidated and partially densified fiber preform with a polymer, and pyrolyzing the polymer; or
introducing a carbon or ceramic foam within the consolidated and partially densified fiber preform by impregnating the consolidated and partially densified fiber preform with a polymer, and pyrolyzing the polymer.

* * * * *